United States Patent [19]

Beasom

[11] Patent Number: 5,438,221
[45] Date of Patent: * Aug. 1, 1995

[54] METHOD AND DEVICE IN WHICH BOTTOMING OF A WELL IN A DIELECTRICALLY ISOLATED ISLAND IS ASSURED

[75] Inventor: James D. Beasom, Melbourne Village, Fla.

[73] Assignee: Harris Corporation, Melbourne, Fla.

[ * ] Notice: The portion of the term of this patent subsequent to Dec. 14, 2010 has been disclaimed.

[21] Appl. No.: 91,819

[22] Filed: Jul. 13, 1993

Related U.S. Application Data

[60] Division of Ser. No. 840,548, Feb. 25, 1992, Pat. No. 5,270,569, which is a continuation-in-part of Ser. No. 651,327, Feb. 5, 1991, Pat. No. 5,306,944, which is a continuation of Ser. No. 470,197, Jan. 24, 1990, abandoned.

[51] Int. Cl.6 .................................... H01L 27/12
[52] U.S. Cl. ..................... 257/520; 257/370; 257/506; 257/510
[58] Field of Search .................. 257/520, 510, 370, 506

[56] References Cited

U.S. PATENT DOCUMENTS

| | | | |
|---|---|---|---|
| 3,378,737 | 4/1968 | Welty | 257/256 |
| 3,725,146 | 4/1973 | Roder | 257/510 |
| 4,602,419 | 7/1986 | Harrison et al. | 257/286 |
| 5,270,569 | 12/1993 | Beasom | 257/506 |

FOREIGN PATENT DOCUMENTS

| | | | |
|---|---|---|---|
| 56-55060 | 5/1981 | Japan | 257/510 |
| 1-115135 | 5/1989 | Japan . | |
| 1-169961 | 7/1989 | Japan . | |

*Primary Examiner*—Sara W. Crane
*Attorney, Agent, or Firm*—Rogers & Killeen

[57] ABSTRACT

A dielectrically isolated island architecture in which the island is contoured inwardly to form one or more projections that penetrate a well separating two regions in the island to assure that the two regions will be electrically isolated without additional processing steps.

10 Claims, 2 Drawing Sheets

METHOD AND DEVICE IN WHICH BOTTOMING OF A WELL IN A DIELECTRICALLY ISOLATED ISLAND IS ASSURED

This is a division of application Ser. No. 840,548, filed Feb. 25, 1992, now U.S. Pat. No. 5,270,569, which is a continuation-in-part application of application Ser. No. 651,327, filed Feb. 5, 1990 now U.S. Pat. No. 5,306,944 which is a continuation of application Ser. No. 470,197, filed Jan. 24, 1990, now abandoned.

The present invention relates in general to semiconductor devices, and in particular to a dielectrically isolated (DI) island architecture in which the island's defining dielectric is contoured inwardly to form one or more projections for the purpose of assuring electrical separation of two regions of the island by a well, that is, for assuring formation of a bottomed well. The present invention has particular utility in the manufacture of integrated circuit switches.

The designers and manufacturers of semiconductor integrated circuits may be faced with competing design criteria when attempting to use a well that extends to the bottom of the island to isolate two regions of the island. For example, in the diffusion doping of an island to form a well, the lateral extent of the well is a function of its depth, generally about 0.5 to 0.8 of the depth. While the lateral extent of the well must be increased to increase the depth of the well, any increase in the lateral extent is generally undesirable from a surface utilization viewpoint.

Moreover, it is sometimes desirable that, within a wafer or an island, some wells reach the bottom of the island and that some wells do not. Since more time is required to diffuse deeper wells, wells of differing depth cannot be diffused in the same processing step. Sequential diffusion of wells of different depth significantly increases manufacturing time.

Further, the depth of a well is not linearly related to diffusion time and significant time may be saved by reducing the depth of a well.

All of these problems are compounded by differing island thickness requirements imposed by other components of the integrated circuit not associated with a particular well.

Finally, there may be significant variations in both island thickness and well depth inherent in the manufacturing process.

In the present invention, local thinning of a dielectrically isolated island so that selected wells are assured of reaching the bottom of the island without additional processing steps is accomplished by controllably tailoring the contour of the island's bottom during anisotropic etching of the island isolation patterns in the wafer. The resulting structure contains one or more projections that extend into the dielectrically isolated island to penetrate the selected wells thereafter diffused into the island. By so doing, contact between the selected wells and the dielectric on the bottom of the island at the projections is assured. Because isolation of two regions of the island (i.e., contact of the well with the dielectric) is required laterally as well as vertically, the process and structure hereinafter described is applicable to any inwardly extending projection (e.g., into the sides and/or bottom of the island).

Projections that extend upwardly into the bottom of a dielectrically isolated island are known. See, for example, Japanese Patent Number 1-115,1352 to Miyano in which a single projection into the bottom of a dielectrically isolated island is shown in a thickness gage, with the thickness of the island being indicated by the resistance value measured between gage contacts on opposite sides of the projection, and with the resistance value being responsive to the depth of penetration, if any, of the projection into the surface resistance layer. Further, the projection may actually cut the island in two when the island is too thin. In such gages, the projection is used merely to determine the depth of the island, the surface resistance layer is not part of the integrated circuit, and the gage contacts are not the contacts of the integrated circuit.

In other known constructions, upward projections are used for reducing the thickness of the layer underlying a topgate in a discrete JFET (U.S. Pat. No. 4,602,419 to Harrison, et al.), for improving frequency response in a discrete JFET (U.S. Pat. No. 3,378,737 to Welty), for reducing series resistance (collector of bipolar transistor; drain of DMOS) where reduced breakdown voltage can be tolerated (Japan Patent No. 1-169,961 to Otowa), and for reducing base-collector capacitance in a junction isolated PNP transistor (Ziegler, et al., "Self-Isolating Bathtub Collector for a Planer Transistor" in *IBM Technical Disclosure Bulletin*, Volume 14, No. 5, October, 1971, pages 1635–1636).

However, in no known integrated circuit is a dielectric projection selectively positioned to ensure well contact.

Accordingly, it is an object of one aspect of the present invention to provide a novel semiconductor structure and method that obviates many of the problems of the prior art.

It is a further object of the present invention to provide a novel method and structure by which contact between a well and the bottom of a dielectrically isolated island may be assured despite variations in the thickness of the island and the depth of the well.

It is another object of the present invention to provide a novel method and structure by which electrical isolation of two regions in a dielectrically isolated island may be assured.

Integrated circuit switches are frequently used to replace space-consuming and troubled-prone electromechanical switches in various applications, such as the test access switches in telephone subscriber line interface circuits (SLICs). The switches, when not on, must block the maximum circuit voltage that may exceed several hundred volts.

Various types of integrated circuit switches are known, and as shown in FIG. 1, such a switch may be formed in an island 10 that is dielectrically isolated from a surrounding substrate 12 by a dielectric layer 14. Switch contacts S1 and S2 may be electrically connected to material of a predetermined conductivity type (e.g., n-type) in a layer 16. The layer 16 is desirably separated into two regions 16A and 16B by a well 18 of material having a conductivity opposite the conductivity of the material in layer 16 (e.g., p-type). Each of the regions 16A and 16B may be electrically connected to one the switch contacts S1 and S2 and the conduction of current between S1 and S2 may be a function of the bias applied to the well 18.

In a switch which has found application in telephony, the switch may include two back-to-back bipolar junction transistors by the addition of a common emitter E inside the well 18 (the base), with the two regions 16A and 16B serving as the collectors of the two transistors.

Appropriately biased, the switch is able to completely block current between S1 and S2 when the well 18 provides complete electrical isolation of the two regions 16A and 16B. Switches of this type are illustrated in the copending application Ser. No. 840,547 of John Prentice filed concurrently herewith and assigned to the assignee hereof, and the disclosure thereof is hereby incorporated herein by reference.

However, the process for manufacturing the integrated circuit switch shown in FIG. 1 may not be sufficiently precise (within reasonably competitive manufacturing cost limits) so as to assure that the well 18 will completely separate the regions 16A and 16B. As may be seen in FIG. 2, the well 18 may not reach the bottom 19 of the island 10, thereby allowing the switch to conduct even when the well 18 is not biased.

In the manufacturing process the well 18 may not reach the bottom of the island 10 if the island 10 is too thick or the well 18 is not deep enough. Typically, the thickness of the island and/or the depth of the well are controllable between maximums and minimums that are determinable, although the thickness and depth are not controllable to a degree to which contact of the well with the bottom of the island may be assured in all instances. For example, in high voltage switches for SLICs, island thicknesses may vary from less than fifteen microns to more than twenty-two microns, and the well 18 may be doped so as to reach a depth of between eighteen and twenty-two microns, leaving a potential four micron gap between the well and the bottom of the island in some switches.

The failure of the well 18 to reach the bottom 19 of the island 16 may also result from the desire to have all wells the same depth because they can then be simultaneously diffused. In addition, the condition illustrated in FIG. 2 may result where the thickness of the island is greater than nominal well depth because of a requirement elsewhere on the wafer for a relatively thicker island, or where it is desirable that some wells bottom and that some do not.

It is accordingly object of another aspect of the present invention to provide a novel integrated circuit switch and method of manufacturing with assured electrical isolation of the switch contacts.

These and many other objects and advantages will be readily apparent to one skilled in the art to which the invention pertains from a perusal of the claims, the appended drawings, and the following detailed description of preferred embodiments.

DESCRIPTION OF PREFERRED EMBODIMENTS

Figure 3:
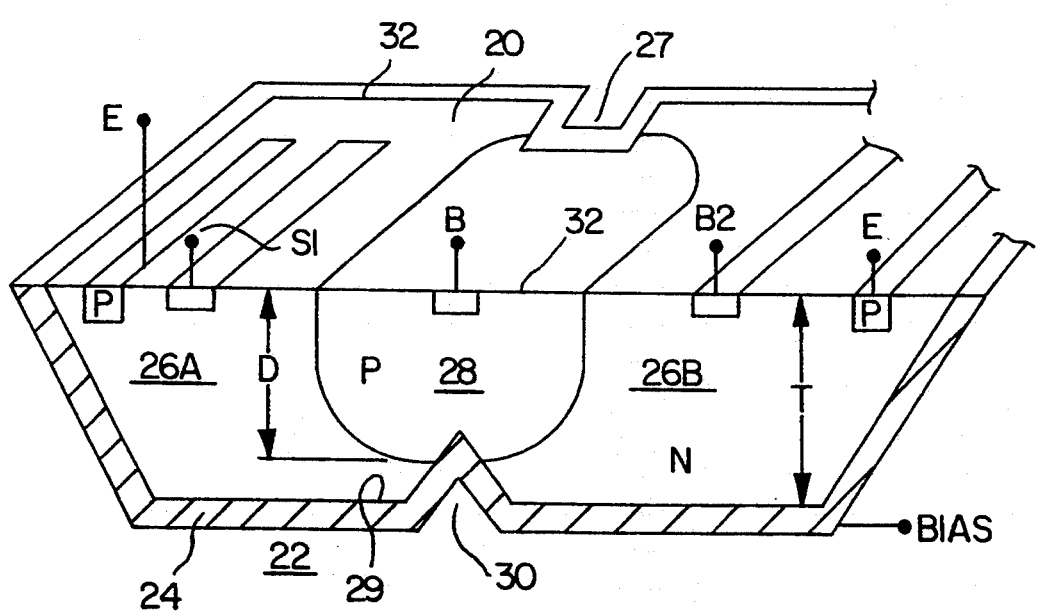
FIG. 3 is an elevational view in cross-section of a dielectrically isolated island illustrating an embodiment of the present invention with a single projection.

With reference now to FIG. 3, the present invention may find application in an integrated circuit switch in an island 20 that is separated from the surrounding structure 22 by an isolation layer 24 and in which switch contacts S1 and S2 are electrically connected to a layer 26 of semiconductor material laving a predetermined conductivity type (e.g. ,n-type). The layer 26 may be divided into regions 26A and 26B, each being associated with one of the switch contacts S1 and S2. A well 28 of a second conductivity type semiconductor (e.g., p-type) may be used to separate the regions 26A and 26B by extending downwardly into the layer 26 to be adjacent (in contact with, or proximity to) the bottom 29 of the island 20. The thickness T of the island 26 and/or the depth D of well 28 may be such that the well 28 may not extend to the bottom 29 of the island 20 to thereby assure electrical separation of the regions 26A and 26B.

Figure 1:
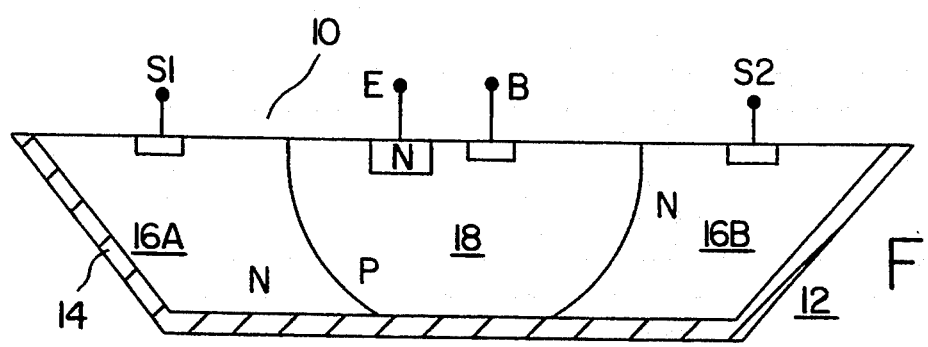
FIG. 1 is an elevational view in cross-section of an integrated circuit illustrating a well extending to the bottom of an island.
Figure 2:
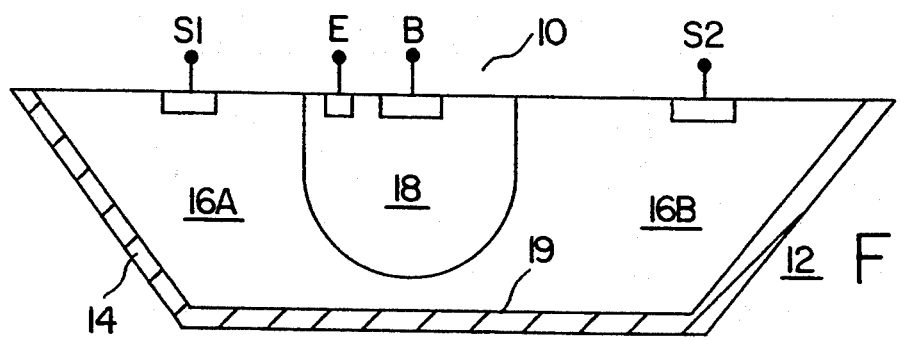
FIG. 2 is all elevational view in cross-section of an integrated circuit illustrating a well which does not extend to the bottom of an island.

By the present invention, electrical separation of the regions 26A and 26B from one another may be assured by the addition of a projection 30 that extends upwardly into the bottom of the island 20 far enough to penetrate the well 28. The distance the projection 30 extends into the island 20 is determined with reference to the actual thickness T of the island and depth D of the well, and should be sufficient to penetrate the region 28. The desired penetration depth of the projection 30 is at least the difference between the maximum island thickness T and minimum well depth D, but less than that needed to leave a well of desired thickness, the desired well thickness being determined principally by the resistance in the conductive path through the well and the breakdown voltage. An increase in unobstructed well depth tends to reduce resistance and increase the breakdown voltage, but these parameters are affected by the specific profiles of well and island doping as well. As a minimum, the projection should not project into the bottom of any PN junction formed in the well (e.g., an emitter such as shown in FIG. 1 may have a nominal depth of about four microns.) In general, the maximum penetration will be less than about 75% of the well depth.

By way of example, in high voltage switches used in telephone SLICs, the island 20 may have a thickness T that varies from fifteen microns to about twenty-two microns. The well 28 may be doped to a depth D of about nineteen to twenty-one microns. In this example, the projection 30 must extend at least three microns to effect penetration of the well, but less than eleven microns to be assured of stopping short of a four micron deep PN junction in the well 28.

Figure 4:
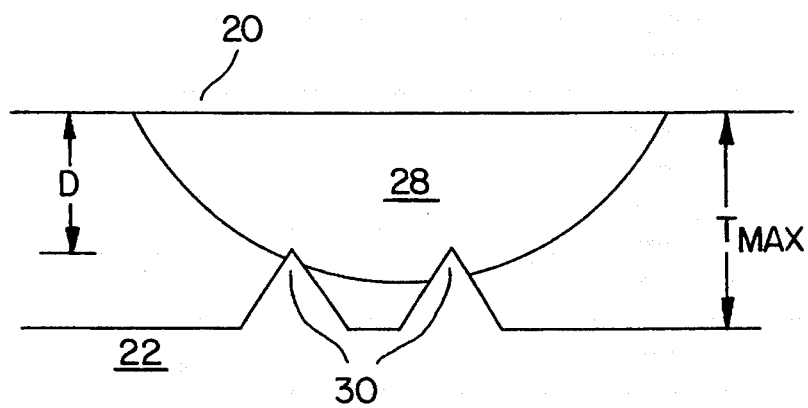
FIG. 4 is an elevational view in cross-section of a dielectrically isolated island illustrating the present invention with two projections and the degree of contact at maximum island thickness.
Figure 5:
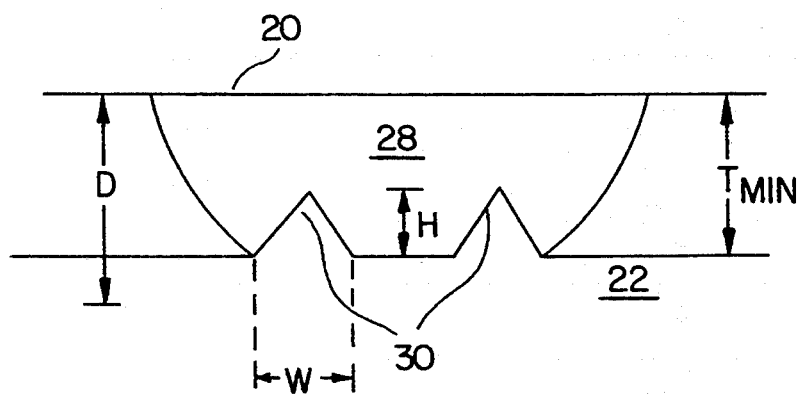
FIG. 5 is an elevational view in cross-section of a dielectrically isolated island illustrating the present invention with two projections and the degree of contact at minimum island thickness.

With reference now to FIGS. 4 and 5, plural projections may be provided in the event a larger region of contact with the well 28 is needed; for example, to prevent lateral depletion through a contact region at too low a voltage. The number of projections and the amount of contact with the well 28 may be determined based on the doping level of the well 28 and the magnitude of the voltage that is to be blocked between switch contacts S1 and S2. Since this involves a determination of the electric field at maximum bias voltage and the solution of ionization integral equations in at least two directions, a combination of computer simulation and experiment may be required for optimization.

When the projections 30 extend deeply into the well 28, it may be desirable to locate emitter contacts E outside the projections 30 to minimize limitations to low saturation resistance due to island thinning in the emitter-collector current path.

The isolation assured by the projections of the present invention may also be useful in the sides of the island-forming tubs of the support structure 22, because electrical isolation is achieved only when the well contacts the surrounding dielectric at both the bottom and the sides of the island. As shown in FIG. 3, a projection 27 into the side 32 may be used to reduce the lateral extent of the well 28, i.e., the well 28 need only approach, rather than contact, the side 32 sufficiently close to be penetrated by the projection 27.

The projection 30 may be formed without the requirement for additional processing steps by controllably tailoring the contour of the island's bottom during anisotropic etching of the island isolation patterns on the wafer. For example, when anisotropically etching a (100) crystal surface of a silicon wafer to form a dielectrically isolated island, an inverted V-shaped projection, or trapezoid-shaped projection, which stops on (111) crystal planes that are inclined at an angle of about 55 degrees with respect to the (100) crystal surface, may be formed using the same etching step employed to form the island isolation patterns. With reference to FIG. 5, the height H of the inverted V-shaped projection may be defined as:

$$H = \tfrac{1}{2}(W \tan 55°) \qquad (1)$$

where W is the width of the mask for the etched pattern that defines the projection. The mask width W can be selected to provide any desired height H. Projection location may be established based on the location of the well 28 and the number of projections 30.

The isolation layer 24 may be formed on the entire surface of the island-forming tub in the substrate 22, including the projections 30. In the event the substrate 22 is itself a dielectric, the isolation layer 24 may be omitted.

It is to be understood that the present invention also has application in integrated circuits other than the above-described switch in which two or more regions are to be assured of being electrically isolated from one another. For example, the bottoming of a P well in an N island in an CMOS process permits the islands (i.e., the bodies of the PMOS devices) to be at different voltage levels and both more positive than the voltage of the P well which separates them.

Further, it may be desirable to bias the substrate to turn off the parasitic MOS. In the switch illustrated in FIG. 3, the region 26A may act as a drain and the region 26B as a source in the body 20, the substrate 22 within the projection 30 as the gate, and the dielectric 24 between the substrate 22 and the well 28 as the gate dielectric. Biasing of the dielectric is desirably at a voltage slightly less than the voltage of the well 28 for a P type well.

Figure 6:
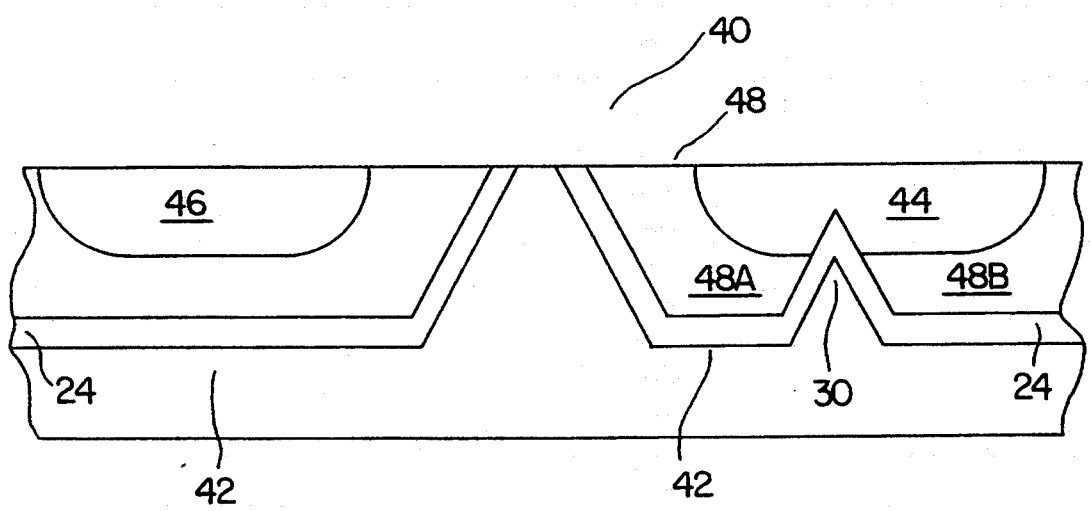
FIG. 6 is an elevational view in cross-section of an embodiment of the present invention with two dielectrically isolated islands, one with an isolating well and one with a non-isolating well.

As illustrated in FIG. 6, the present invention may find application in a wafer 40 with plural semiconductor devices 42, some of which have isolating wells 44 and some of which have non-isolating wells 46. Projections 30 may be provided in devices 42 having isolating wells 44 therein so that the island 48 is divided into electrically isolated regions 48A and 48B.

While the projections may have shapes other than those described herein, inverted Vs in the bottom and rectangles in the sides are preferred because they can be made with the steps used to etch the isolation patterns that form dielectrically isolated islands at no additional manufacturing cost.

The present invention has many advantages. For example, the depth, and thus the surface area, of wells may be reduced, thereby saving both diffusion time and space on the chip. By selectively locating projections, bottoming of some wells can be assured while other wells of the same depth can remain out of contact with the bottom, e.g., where vertical transistors are desired. Moreover, greater manufacturing tolerances may be tolerated, resulting in both reduced processing cost and increased yields.

While preferred embodiments of the present invention have been described, it is to be understood that the embodiments described are illustrative only and that the scope of the invention is to be defined solely by the appended claims when accorded a full range of equivalence, many variations and modifications naturally occurring to those skilled in the art from a perusal hereof.

I claim:

1. A dielectrically isolated semiconductor island of a first conductivity type having two regions electrically isolated from each other, each of the two regions being connected to a switch contact comprising:
   (a) a dielectric support for the island having an inwardly extending projection;
   (b) a semiconductor island of a first conductivity type supported by said support; and
   (c) a well adapted to receive a bias voltage that controls the flow of current between said switch contacts, said well being of a second conductivity type semiconductor in said island extending sufficiently to contact said projection and thereby electrically separate the island into two regions.

2. The island of claim 1 wherein the thickness of said island is between about 15 and about 22 microns;
   wherein the depth of said well is between about 19 and about 21 microns; and
   wherein said projection extends upwardly to a height between about 3 and about 11 microns.

3. The island of claim 2 wherein said projection is an inverted V.

4. A semiconductor device comprising:
   (a) a dielectrically isolated island of a first conductivity type semiconductor having a dielectric covered rectangular projection into a side thereof; and
   (b) a well of a second conductivity type semiconductor in said island at a location adjacent said projection, said well having a surface area sufficient to allow the well to contact the projection,
   whereby the surface area of the well needed to electrically separate portions of said island is less than the surface area so needed in the absence of said projection.

5. The device of claim 4 further comprising an inverted V-shaped dielectric projection extending upwardly into the bottom of said well.

6. An integrated circuit having two spaced-apart contacts comprising:
   a dielectrically isolated semiconductor island of a first conductivity type, the thickness of said island is between about 15 and about 22 microns;

two spaced-apart contacts, each operatively connected to one of two spaced-apart regions of said island;

a well of a second conductivity type semiconductor with a depth between about 19 and about 21 microns located intermediate said two regions of said island; and an inwardly extending projection extending into the island intermediate said two regions upwardly to a height between about 3 and about 11 microns to penetrate said well.

7. The device of claim 6 wherein the shape of said projection is an inverted V.

8. An integrated circuit for controlling current flow between two contacts responsively to application of a bias current, the device having an electrically isolated island of a first conductivity type semiconductor, the improvement comprising:

a first dielectric projection into said island;

at least one additional projection into said well wherein the number of said projections is related to the desired potential across the junction;

a well of a second conductivity type semiconductor that forms a junction in said island that extends from the top thereof to said first projection for electrically isolating two regions of said island, each of said two regions being connected to one of said contacts; and a section of the first conductivity type semiconductor in said well that is adapted to receive a bias current for reducing an electrical potential across the junction, whereby current flow between the two contacts is controlled by application of the bias current.

9. An integrated circuit with two bipolar junction transistors in a dielectrically isolated island comprising:

two spaced-apart collectors in a dielectrically isolated island of a first conductivity type semiconductor, one for each of the bipolar junction transistors;

a base well of a second conductivity type semiconductor between said two collectors extending into the island; and an emitter contact of the first conductivity type in said well; and at least one dielectric projection extending into the island to penetrate the base well for electrically isolating said two collectors from one another.

10. An integrated circuit with two bipolar junction transistors in a dielectrically isolated island comprising:

two spaced-apart collectors in a dielectrically isolated island of a first conductivity type semiconductor, one for each of the bipolar junction transistors;

a base well of a second conductivity type semiconductor between said two collectors extending into the island; and an emitter contact of the second conductivity type in each of said collectors; and at least one dielectric projection extending into the island to penetrate the base well for electrically isolating said two collectors from one another.

* * * * *